(12) United States Patent
Turner et al.

(10) Patent No.: US 6,629,311 B1
(45) Date of Patent: Sep. 30, 2003

(54) APPARATUS AND METHOD FOR CONFIGURING A PROGRAMMABLE LOGIC DEVICE WITH A CONFIGURATION CONTROLLER OPERATING AS AN INTERFACE TO A CONFIGURATION MEMORY

(75) Inventors: John Turner, Santa Cruz, CA (US); Denis Berlan, Atherton, CA (US)

(73) Assignee: Altera Corporation, San Jose, CA (US)

( * ) Notice: Subject to any disclaimer, the term of this patent is extended or adjusted under 35 U.S.C. 154(b) by 147 days.

(21) Appl. No.: 09/715,361

(22) Filed: Nov. 17, 2000

Related U.S. Application Data
(60) Provisional application No. 60/166,048, filed on Nov. 17, 1999.

(51) Int. Cl.[7] .............................................. G06F 17/50
(52) U.S. Cl. ......................................... 716/17; 716/18
(58) Field of Search .............................. 326/38–41, 105; 438/6; 710/74, 307; 711/219; 714/724–727; 716/17, 18

(56) References Cited

U.S. PATENT DOCUMENTS

| | | | | |
|---|---|---|---|---|
| 5,159,598 A | * | 10/1992 | Welles, II et al. | 714/724 |
| 6,049,222 A | * | 4/2000 | Lawman | 326/38 |
| 6,274,391 B1 | * | 8/2001 | Wachtler et al. | 438/6 |
| 6,292,018 B1 | * | 9/2001 | Kean | 326/41 |

* cited by examiner

Primary Examiner—Leigh M. Garbowski
Assistant Examiner—Naum Levin
(74) Attorney, Agent, or Firm—Pennie & Edmonds LLP

(57) ABSTRACT

An apparatus to configure a programmable logic device includes a configuration memory to store configuration data. A configuration controller retrieves the configuration data, converts the configuration data to re-fomatted configuration data, and passes the re-formatted configuration data to a programmable logic device. In one embodiment, the configuration controller is positioned on the configuration memory to form a stacked module, which is positioned within a single housing.

28 Claims, 6 Drawing Sheets

APPARATUS AND METHOD FOR CONFIGURING A PROGRAMMABLE LOGIC DEVICE WITH A CONFIGURATION CONTROLLER OPERATING AS AN INTERFACE TO A CONFIGURATION MEMORY

This application claims priority to the U.S. Provisional Patent Application entitled, "Apparatus and Method for Configuring a Programmable Logic Device with a Configuration Controller Operating as an Interface to a Configuration Memory," Ser. No. 60/166,048, filed Nov. 17, 1999.

BRIEF DESCRIPTION OF THE INVENTION

This invention relates generally to the programming of programmable logic devices. More particularly, this invention relates to a technique for programming a programmable logic device with a configuration controller that operates as an interface with a configuration memory.

BACKGROUND OF THE INVENTION

Programmable logic devices are well known in the art. A programmable logic device or PLD allows a user to electrically program standard, off-the-shelf logic elements to meet a user's specific needs. PLDs are currently represented by, for example, Altera's MAX® series of PLDs, FLEX® series of PLDs, and APEX® series of PLDs, each sold by Altera Corporation, San Jose, Calif.

In many PLDs, configuration data from a configuration memory is downloaded into a programmable logic device upon start-up of a system. Once the configuration data is downloaded into the programmable logic device, the programmable logic device executes the logic functions specified by the configuration data.

Controllers have been used to coordinate the transfer of configuration data from a configuration memory to a programmable logic device. One problem with such prior art controllers is that they take up space on a system board. In other words, they are not integrated with a configuration memory, and therefore produce a relatively large footprint in an electronic system. Another problem with prior art controllers is that they are relatively inflexible. For example, they do not have the ability to decompress configuration data and they do not provide programmable clock frequency control.

In view of the foregoing, it would be highly desirable to provide an improved technique for programming programmable logic devices.

SUMMARY OF THE INVENTION

The apparatus of the invention operates to configure a programmable logic device. The apparatus includes a configuration memory to store configuration data. A configuration controller retrieves the configuration data, converts the configuration data to re-formatted configuration data, and passes the re-formatted configuration data to a programmable logic device. In one embodiment, the configuration controller is positioned on the configuration memory to form a stacked module, which is positioned within a single housing.

The method of the invention configures a programmable logic device. The method includes the step of retrieving configuration data from a configuration memory. The configuration data is converted to re-formatted configuration data. The re-formatted configuration data is then passed to a programmable logic device.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 1:
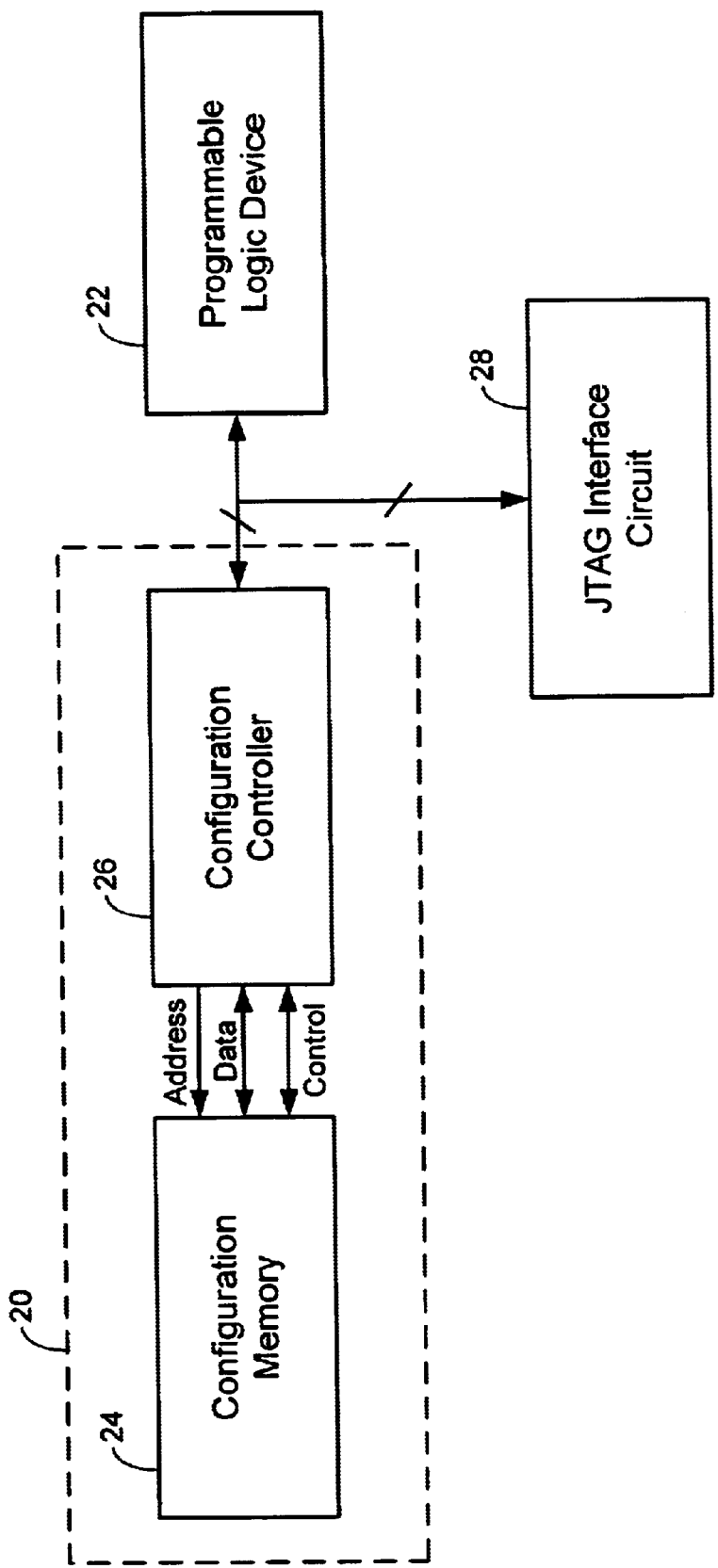
FIG. 1 illustrates a configuration system in accordance with an embodiment of the invention.

FIG. 1 illustrates a configuration system 20 constructed in accordance with an embodiment of the invention. The configuration system 20 is used to configure a programmable logic device 22. The configuration system 20 includes a configuration memory 24 and a configuration controller 26. Address, data, and control lines are positioned between the configuration memory 24 and the configuration controller 26. An interface circuit 28 is used to access the configuration controller 26. For example, a JTAG interface circuit 28 may be used to access the configuration controller 26. The JTAG interface circuit 28 complies with the industry-standard 4-pin Joint Test Action Group (JTAG) interface (IEEE Std. 1149.1).

Figure 2:
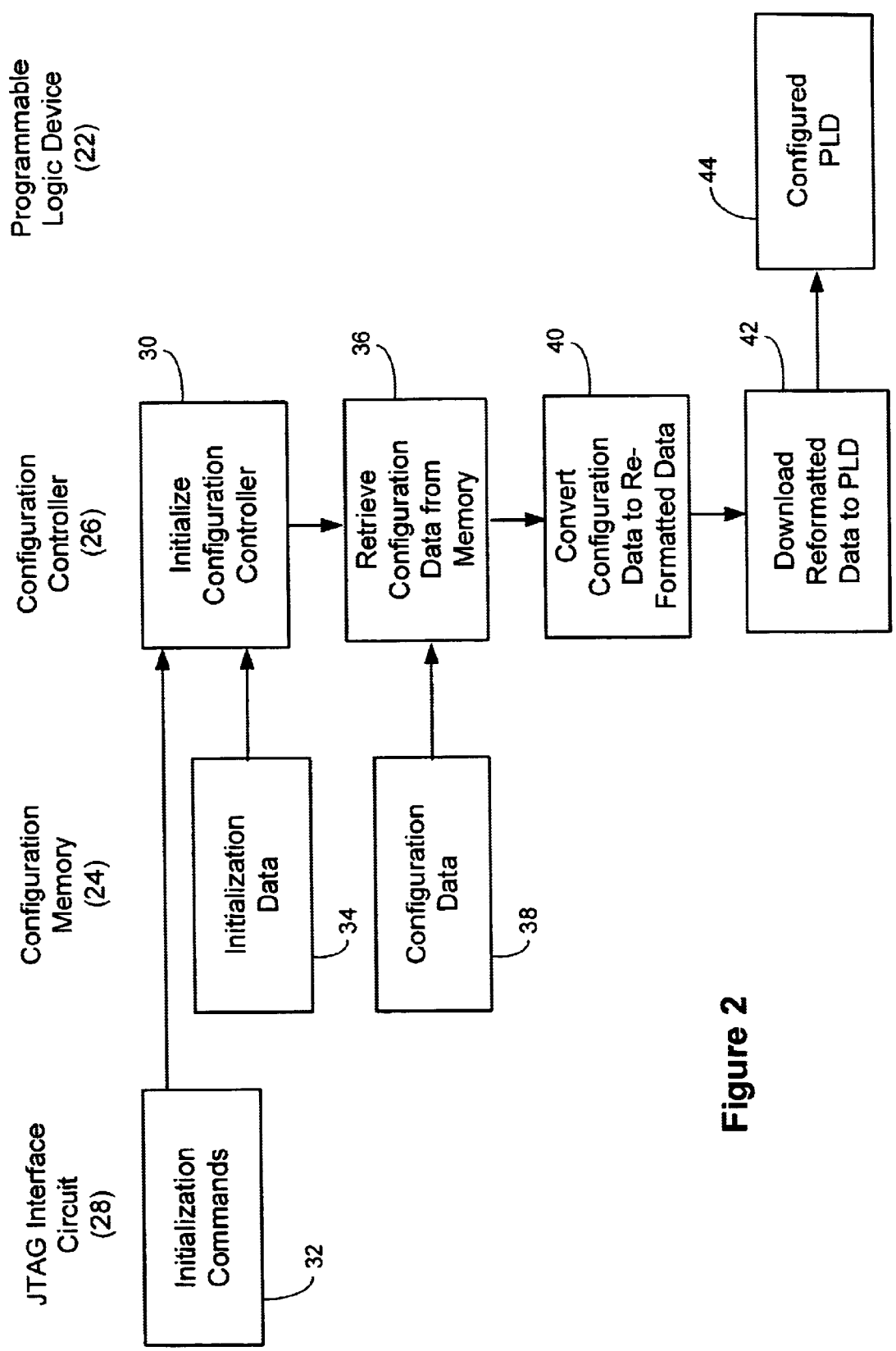
FIG. 2 illustrates processing steps performed by the configuration system of the invention.

FIG. 2 illustrates the processing steps performed by the components shown in FIG. 1. As shown in FIG. 2, first the configuration controller 26 is initialized (step 30). Initialization is invoked in response to initialization commands 32 from the interface circuit 28. At initialization, initialization data 34 is routed to the configuration controller 30. The initialization data 34 includes data to initialize the operation of the configuration controller 26, and may also include configuration data. The initialization data 34 preferably includes initialization data specifying a data download channel width. This variable specifies whether re-formatted data from the configuration controller 26 should be applied to the programmable logic device 22 via a 1, 2, 4, 8, or other bit channel size. The initialization data 34 may also include a programmable clock frequency variable.

After the configuration controller 26 is initialized at step 30, configuration data 38 is retrieved from the configuration memory 24. The configuration controller 26 may be implemented with fixed logic gates and programmable registers, which store the initialization data. In one embodiment, the configuration controller 26 includes one or more decompression circuits to decompress configuration data 38. In another embodiment, the configuration controller includes a programmable clock frequency generator, which is responsive to a programmable clock frequency variable received with the initialization data.

Preferably, the configuration controller 26 steps through a sequence of memory addresses in the configuration memory 24 to obtain the configuration data 38. In particular, the configuration controller 26 applies the sequence of addresses to the address lines, while activating the appropriate control signals. Data from the configuration memory 24 is then passed to the configuration controller 26.

The configuration data is then processed to form re-formatted data (step 40). In particular, the configuration data is initially stored by the configuration memory 24 and is then converted to a specified format for the programmable logic device of interest. The re-formatted data will commonly be in a serial format. As used herein, the term "re-formatted data" refers to any configuration data that passes through the configuration controller, whether processed or not. In most cases the re-formatted data will be processed by the configuration controller in one manner or another. For example, the configuration controller may operate to decompress the configuration data.

The re-formatted data is passed to the programmable logic device (step 42). This results in a configured programmable logic device 44.

Those skilled in the art will recognize a number of advantages associated with the disclosed system. First, a user is not required to generate a complex set of control signals for the configuration memory 24. Instead, the configuration controller 26 generates the required signals to obtain the configuration data from the configuration memory 24. In other words, a simple set of commands are applied to the configuration controller 26. In response to the simple commands, the complex commands for accessing a memory are generated.

Another benefit of the invention is that the configuration controller may receive initialization data, such as a data download channel width to optimize the operation of the configuration controller 26. As indicated above, the initialization data may include a programmable clock frequency variable.

Figure 3:
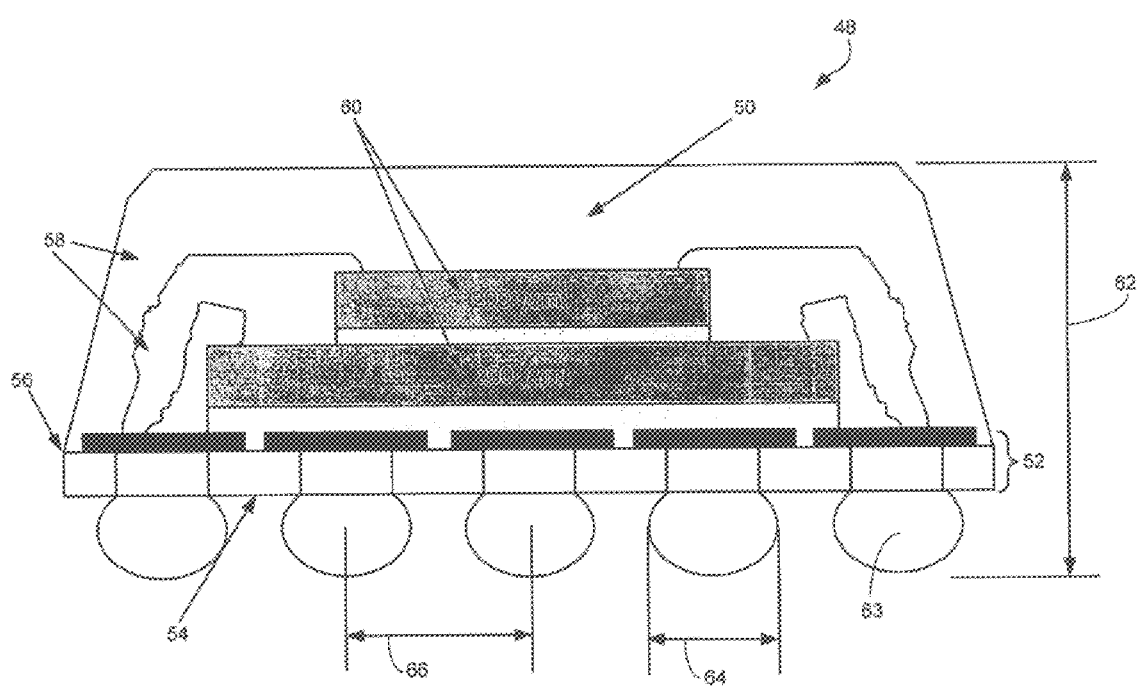
FIG. 3 illustrates the configuration system of the invention forming a stacked module within a single housing.

FIG. 3 illustrates that the configuration memory 24 and configuration controller 26 may be combined in a single package 48. By way of example, the package 48 may include a molded resin 50 and a lead frame 52. The lead frame 52 may be formed with a polyimide substrate 54 with trace patterns 56 formed therein. Bond wires 58 may be used to establish appropriate electrical links between the configuration memory 24 and the configuration controller 26.

Insulator layers 60 are used to form a stacked module including the configuration memory 24 and the configuration controller 26. One insulator layer is positioned between the configuration memory 24 and the configuration controller 26, while another insulator layer is positioned between the configuration memory 24 and the lead frame 52.

In one embodiment of the invention, the configuration memory 24 and the configuration controller 26 are each lapped to a thickness of 200 $\mu$. The invention has been implemented with a total package height, as shown with arrow 62 of approximately 1.25 mm. In one embodiment each bond ball 63 has a diameter 64 of approximately 0.45 mm, with a pitch 63 between bond balls of approximately 0.8 mm.

Figure 4:
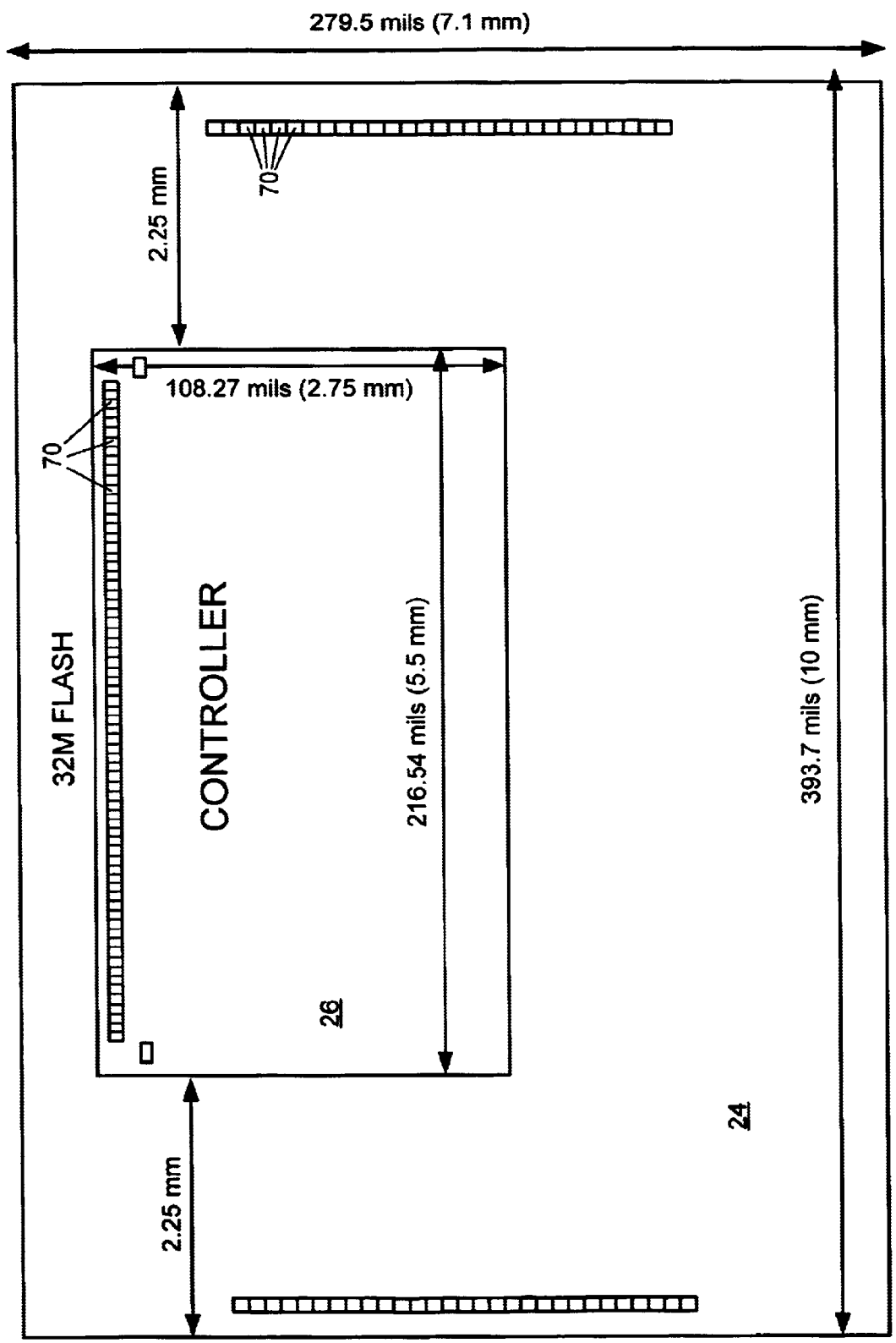
FIG. 4 is a top view of the configuration system of FIG. 3.

FIG. 4 is a top view of the stacked module shown in FIG. 3. FIG. 4 illustrates the configuration controller 26 positioned on the configuration memory 24. The figure also illustrates bond pads 70, which are used to establish electrical links between the configuration controller 26 and the configuration memory 24. FIG. 4 also illustrates features sizes associated with one implementation of the invention.

Those skilled in the art will recognize that the invention provides for a single compact package enclosing both a configuration memory and a configuration memory controller. This compact package reduces the footprint of the system. It should be appreciated that the housing 48 illustrated in FIG. 3 is exemplary; alternate configurations, including flip-chip arrangements and multi-chip modules, may also be used in accordance with the invention.

Figure 5:
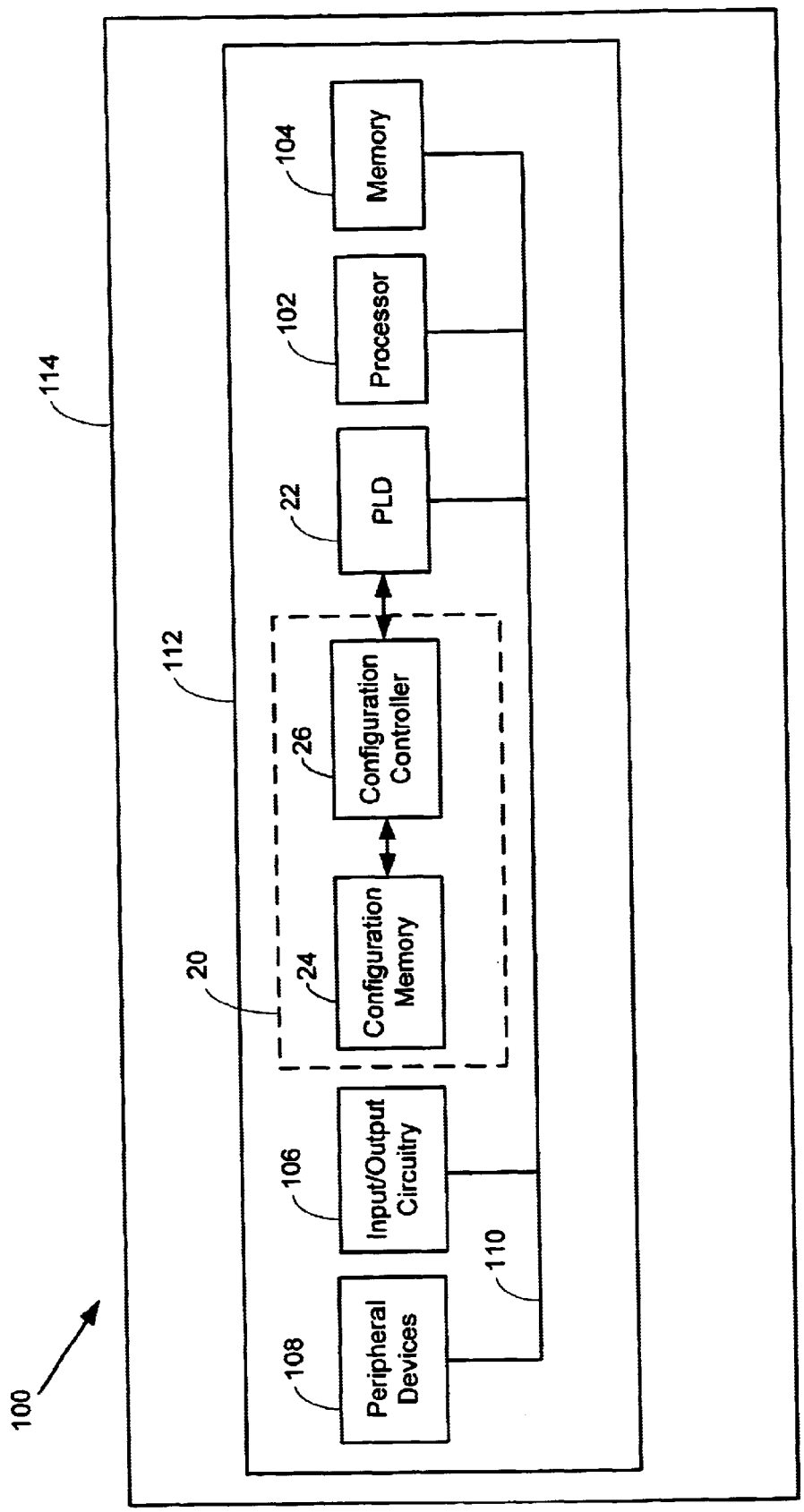
FIG. 5 illustrates an electronic system incorporating the configuration system of the invention.

The configuration system 20 may be incorporated into a large digital system of the type shown in FIG. 5. For example, the configuration system 20 may form a part of a data processing system 100. The data processing system 100 may include one or more of the following components: a processor 102, a memory 104, input/output circuitry 106, and peripheral devices 108. These components are coupled together by a system bus 110 and are populated on a circuit board 112, which is contained in an end-user system 114.

The system 100 can be used in a wide variety of applications such as computer networking, data networking, instrumentation, video processing digital signal processing. or any other application where the advantage of using re-programmable logic is desirable. The PLD 22 may be configured by the configuration system 20 to perform a variety of logic functions. For example, the PLD 22 can be configured as a processor or controller that works in cooperation with processor 102. The PLD 22 may also be used as an arbiter for arbitrating access to a shared resource in the system 100. In yet another example, the PLD 22 can be configured as an interface between the processor 102 and one of the other components in the system 100.

Figure 6:
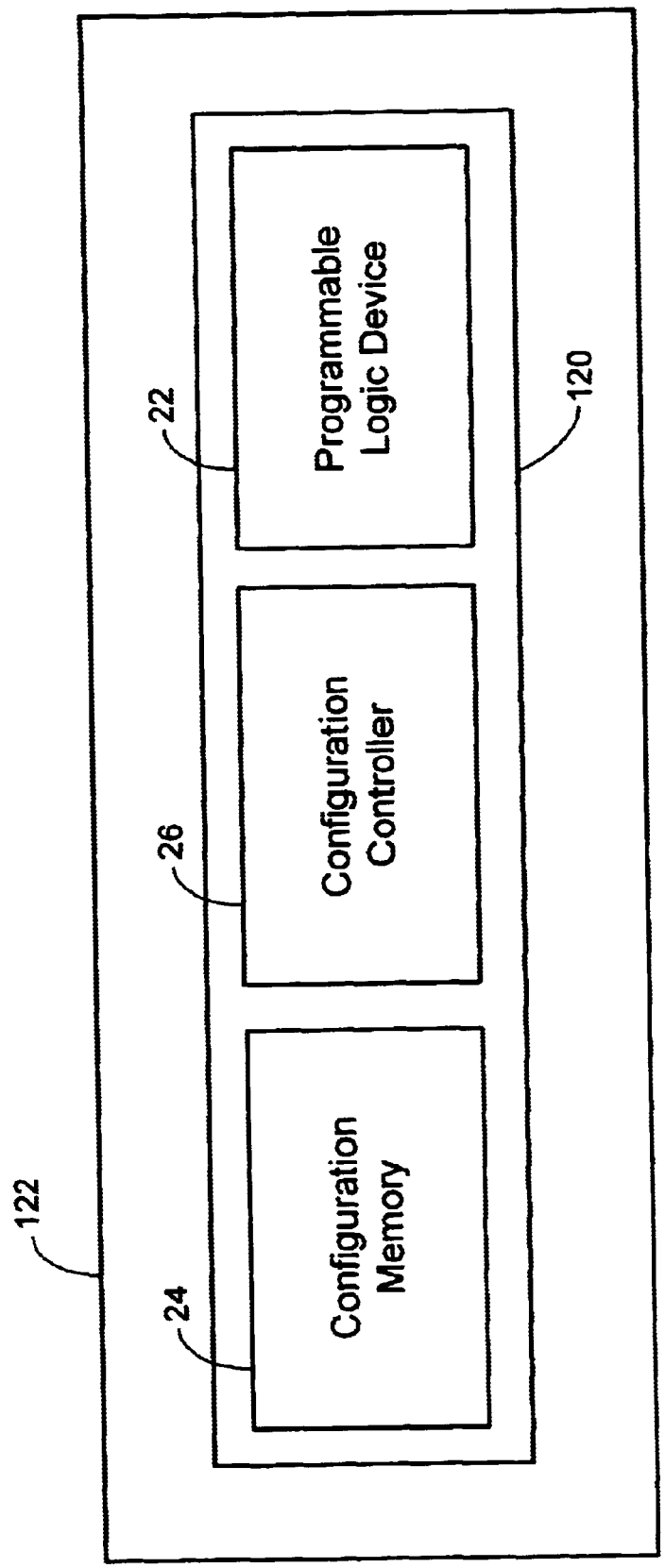
FIG. 6 illustrates an alternate embodiment of the invention.

FIG. 6 illustrates an alternate embodiment of the invention wherein the configuration memory 24, configuration controller 26, and programmable logic device 22 are positioned in a single housing 122. These individual elements may be formed in individual dice or they may be implemented in a single semiconductor substrate 120.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and.described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. An apparatus to configure a programmable logic device, comprising
   a configuration memory to store configuration data;
   a configuration controller to
     retrieve said configuration data,
     convert said configuration data to re-formatted configuration data, and
     pass said re-formatted configuration data to a programmable logic device; and
   a housing enclosing said configuration memory and said configuration controller.

2. The apparatus of claim 1 wherein said configuration controller is positioned on said configuration memory to form a stacked module.

3. The apparatus of claim 1 wherein said housing includes a lead frame and a molded resin.

4. The apparatus of claim 1 wherein said configuration controller decompresses said configuration data.

5. The apparatus of claim 1 in combination with a system bus.

6. The apparatus of claim 5 further comprising a programmable logic device connected to said system bus.

7. The apparatus of claim 5 further comprising a processor connected to said system bus.

8. The apparatus of claim 5 further comprising a peripheral device connected to said system bus.

9. The apparatus of claim 5 further comprising input/output circuitry connected to said system bus.

10. A method of configuring a programmable logic device, comprising:
    initializing a configuration controller by
        receiving initialization commands from an external interface circuit; and
        accepting initialization data from a configuration memory;
        wherein the initialization data specifies a data download channel width or a programmable clock frequency;
    retrieving configuration data from said configuration memory;
    converting said configuration data to re-formatted configuration data; and
    passing said re-formatted configuration data to a programmable logic device using the initialization data.

11. An electronic device, comprising:
    a first integrated circuit storing configuration information; and
    a second integrated circuit to produce control data from said configuration information, said control data being supplied to a logic circuit having at least one programmable element, said second integrated circuit being in a stacked configuration with said first integrated circuit.

12. The electronic device of claim 11 further comprising a housing enclosing said first integrated circuit and said second integrated circuit.

13. The electronic device of claim 12 further comprising a programmable logic device positioned within said housing.

14. The electronic device of claim 11 wherein said second integrated circuit is responsive to a control signal from an interface circuit.

15. The electronic device of claim 11 wherein said second integrated circuit is responsive to a control signal from a Joint Test Action Group interface circuit.

16. An electronic device, comprising:
    a logic circuit having at least one programmable logic element;
    a memory coupled to said logic circuit for storing data;
    a control circuit, coupled to said memory, operable to selectively reformat and pass said data to said logic circuit; and
    a housing enclosing said logic circuit, said memory, and said control circuit.

17. The electronic device of claim 16, wherein said control circuit is a configuration controller.

18. The electronic device of claim 17, wherein said configuration controller includes a decompression circuit.

19. The electronic device of claim 16, wherein said logic circuit, said memory, and said control circuit are fabricated in a single integrated circuit.

20. An electronic device for configuring a programmable logic device, comprising:
    a configuration memory implemented on a first integrated circuit chip for storing configuration data; and
    a configuration controller implemented on a second integrated circuit chip for retrieving said configuration data from said configuration memory, converting said retrieved configuration data to re-formatted configuration data and passing said re-formatted configuration data to a programmable logic device;
    wherein said first and second integrated circuit chips are enclosed in a single package.

21. The electronic device of claim 20, wherein said first and second integrated circuit chips are positioned one on top of the other to form a stacked module.

22. The electronic device of claim 21, wherein said first integrated circuit chip is positioned on top of a lead frame of said package and said second integrated circuit chip is positioned on top of said first integrated circuit chip.

23. The electronic device of claim 22, wherein said second integrated circuit chip is positioned eccentrically on said first integrated circuit chip.

24. The electronic device of claim 20 in combination with at least one of a processor, a peripheral device and input/output circuitry, said programmable logic device and said at least one of said processor, peripheral device and input/output circuitry being connected to a common system bus.

25. An apparatus for configuring a programmable logic device, comprising:
    a configuration memory implemented on a first integrated circuit chip for storing configuration data and one or more programmable controller operation parameters; and
    a configuration controller implemented on a second integrated circuit chip for carrying out a configuration operation in response to receiving an initialization command, said configuration operation including retrieving said configuration data from said configuration memory, converting said retrieved configuration data to re-formatted configuration data and passing said re-formatted configuration data to a programmable logic device;
    wherein said configuration controller, upon reception of said initialization command, retrieves said one or more controller operation parameters and carries out said configuration operation based on said retrieved one or more controller operation parameters.

26. The apparatus of claim 25, wherein said one or more controller operation parameters include a parameter specifying a size of a download channel used by said configuration controller for passing said configuration data to said programmable logic device.

27. The apparatus of claim 26, wherein said size of said download channel is programmable to values of 1, 2, 4, and 8 bits.

28. The apparatus of claim 25, wherein said one or more controller operation parameters include a parameter specifying a clock speed at which said configuration controller passes said configuration data to said programmable logic device.

* * * * *